United States Patent
Adamec

(10) Patent No.: US 8,674,300 B2
(45) Date of Patent: Mar. 18, 2014

(54) FEEDBACK LOOP FOR EMITTER FLASHING

(75) Inventor: Pavel Adamec, Haar (DE)

(73) Assignee: ICT Integrated Circuit Testing Gesellschaft fur Halbleiterprüftechnik mbH, Heimstetten (DE)

( * ) Notice: Subject to any disclaimer, the term of this patent is extended or adjusted under 35 U.S.C. 154(b) by 142 days.

(21) Appl. No.: 12/910,502

(22) Filed: Oct. 22, 2010

(65) Prior Publication Data

US 2011/0221360 A1    Sep. 15, 2011

(30) Foreign Application Priority Data

Mar. 10, 2010   (EP) .................................... 10156118

(51) Int. Cl.
*H05B 37/02*    (2006.01)

(52) U.S. Cl.
USPC ........................... 250/307; 250/306; 250/310

(58) Field of Classification Search
USPC .................................. 250/306, 307, 310, 311
See application file for complete search history.

(56) References Cited

U.S. PATENT DOCUMENTS

| | | | | |
|---|---|---|---|---|
| 3,786,268 A | * | 1/1974 | Nomura | 250/311 |
| 3,809,899 A | * | 5/1974 | Baker et al. | 250/311 |
| 3,887,835 A | * | 6/1975 | Nomura | 315/94 |
| 3,887,839 A | * | 6/1975 | Ota et al. | 315/383 |
| 7,501,638 B1 | * | 3/2009 | Zhou | 250/396 R |
| 7,595,490 B2 | * | 9/2009 | Zhou et al. | 250/310 |
| 8,143,589 B2 | * | 3/2012 | Winkler et al. | 250/423 R |
| 2007/0158588 A1 | * | 7/2007 | Zhou et al. | 250/492.2 |
| 2008/0284332 A1 | * | 11/2008 | Adamec | 313/558 |
| 2009/0121160 A1 | * | 5/2009 | Winkler et al. | 250/503.1 |
| 2009/0200497 A1 | * | 8/2009 | Adamec et al. | 250/503.1 |

FOREIGN PATENT DOCUMENTS

| | | |
|---|---|---|
| EP | 1760761 A1 | 3/2007 |
| EP | 2088614 | 8/2009 |
| WO | WO2007/067296 A2 | 6/2007 |

OTHER PUBLICATIONS

Extended European Search Report, EP Application No. 10156118.1, Jul. 26, 2010.

* cited by examiner

*Primary Examiner* — David A Vanore
*Assistant Examiner* — Wyatt Stoffa
(74) *Attorney, Agent, or Firm* — Patterson & Sheridan, LLP

(57) ABSTRACT

A method and a device for stabilizing the emission current of an emitter of a charged particle beam device are provided. In the method, the emitter is operated under predetermined operation parameters including at least one voltage with a predetermined value. The method includes determining a first value of the emission current under the predetermined operation parameters and flash cleaning the emitter while a first electric field is applied to the emitter. The first electric field is generated by the at least one voltage having a first value of the at least one voltage, wherein the first value of the at least one voltage is provided in dependence of the determined first value of the emission current.

20 Claims, 4 Drawing Sheets

FEEDBACK LOOP FOR EMITTER FLASHING

FIELD OF THE INVENTION

The embodiments of the present invention relate to stabilizing the emission current of an emitter of a charged particle beam device. Typically, the emitter is a cold field emitter with an emitter tip. Particular embodiments of the present invention relate to a method and a device for stabilizing the emission current of an emitter of a charged particle beam device, including a feedback loop system.

BACKGROUND OF THE INVENTION

Charged particle beam apparatuses have many functions, in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Charged particle beam devices are typically operated under vacuum conditions. Still, molecules of the residual gas, possibly also molecules desorbed from surfaces of the charged particle beam device, e.g. from extractor, anode, apertures and the like, can adsorb on the emission surface of an emitter. This adsorption of molecules can cause fluctuations of the emission current.

To counteract the adsorption, or even deposition, of particles on the emitter, the emitter can be subjected to flash cleaning. Flash cleaning is typically done by shortly heating the emitter to a high temperature, e.g. 2000 K, such that the adsorbed molecules are desorbed and the emitter is purged. Flash cleaning can be repeated periodically as needed.

However, after flash cleaning, it is found that the emission current may still be different from what it was before. The variations can e.g. consist in drift and/or fluctuation, in particular when flash cleaning is repeated from time to time. While flash cleaning eliminates or reduces the destabilization of the emission current due to adsorption of residual gas molecules, other sources of destabilization are introduced.

Thus, to avoid this undesired effect, there is a need for an improved method for operating a charged particle device, in particular a method for stabilizing the emission current, and for a corresponding device.

SUMMARY OF THE INVENTION

In light of the above, a method for stabilizing the emission current of an emitter of a charged particle beam device according to independent claim 1 and a device for stabilizing the emission current of an emitter of a charged particle beam device according to independent claim 10 are provided.

According to an embodiment, a method for stabilizing the emission current of an emitter of a charged particle beam device is provided. In the method, the emitter is operated under predetermined operation parameters including at least one voltage with a predetermined value of the at least one voltage. The method includes determining a first value of the emission current under the predetermined operation parameters and flash cleaning the emitter while a first electric field is applied to the emitter. The first electric field is generated by the at least one voltage having a first value of the at least one voltage, wherein the first value of the at least one voltage is provided in dependence of the determined first value of the emission current.

According to another embodiment, a method for stabilizing the emission current of an emitter of a charged particle beam device is provided. In the method, the emitter is operated under predetermined operation parameters including at least one voltage with a predetermined value of the at least one voltage. The method includes flash cleaning the emitter while a first electric field is applied to the emitter. The first electric field is generated by the at least one voltage having a first value of the at least one voltage, wherein the first value of the at least one voltage is provided in dependence of a calculated or measured optimal electric field for stabilization of the emitter shape during flash cleaning.

According to another embodiment, a device for stabilizing the emission current of an emitter of a charged particle beam device is provided. The device includes the emitter for emitting a charged particle beam defining an emission current. The emission current has a value under predetermined operation parameters. The predetermined operation parameters include at least one voltage with a predetermined value of the at least one voltage. The device further includes a voltage generating system for providing the at least one voltage to the charged particle beam device. The voltage generating system is adapted to provide the at least one voltage with the predetermined value during operation under the predetermined operation parameters, and is adapted to provide the at least one operation voltage with an adaptable value of the at least one voltage during flash cleaning of the emitter. The device further includes a measurement unit for determining a value of the emission current and a feedback loop system. The feedback loop system is operatively coupled to the measurement unit for receiving the determined value of the emission current, and is operatively coupled to the voltage generating system for controlling the adaptable value of the at least one voltage during flash cleaning of the emitter in dependence of the received value of the emission current.

The invention is also directed to an apparatus for carrying out the disclosed method, including apparatus parts for performing each of the described method steps. These method steps may be performed by way of hardware components, a computer programmed by appropriate software, by any combination of the two or in any other manner. Furthermore, the invention is also directed to methods by which the described device operates and to uses thereof. It includes method steps for carrying out every function of the device. The invention is also directed to a process of manufacturing the described device.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF THE INVENTION

Figure 1:
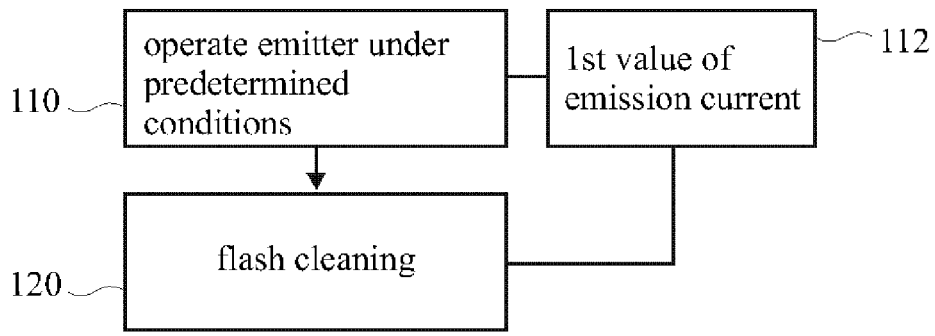
FIG. 1 illustrates a method for stabilizing the emission current of an emitter of a charged particle beam device according to embodiments described herein.

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting embodiments of the invention described herein, in the following the charged particle beam device or components thereof might especially be utilized for electron microscope inspection or lithography. The present invention can still be applied for apparatuses and components using other sources of charged particles, e.g. ions, and/or other secondary and/or backscattered charged particles to obtain a specimen image.

Without any further clarification, potentials and voltages referred to in the application are understood as relative potentials in comparison to the potential of a specimen. For example, accelerating the beam by connecting an emitter to "ground" and applying 3 kV to an extractor is equivalent to applying negative 3 kV to the emitter and connecting the emitter to ground. Therefore, while for convenience some discussion is provided in terms of specific voltages, it should be understood that reference is made to relative potentials.

In many applications, e.g. for beam lithography or for inspection of specimen, charged particle beam devices are used, e.g. electron or ion beam devices. When operated under predetermined operation parameters or conditions, the emitter of the charged particle beam device emits a charged particle beam, e.g. an electron beam or ion beam. Typically, the charged particle beam column is operated under vacuum conditions. These vacuum conditions may be different along the column according to need. In the emission area, typically the gun chamber, a high or even ultra high vacuum may be present. For example, ultra high vacuum conditions can be at pressures lower than $10^{-7}$ Pa, or even lower than $10^{-8}$ Pa, e.g. about $10^{-9}$ Pa.

However, even if operated under such vacuum conditions, molecules of the residual gas occasionally adsorb on the emission surface. Thereby, the value of the emission current (current represented by the emitted charged particle beam, respectively current flowing through the emitter) may change over time. Fluctuations in the emission current, however, are typically not desired. A cold field emitter can be particularly sensitive to the vacuum level in which it is operated.

Improving the vacuum level is often not feasible. This means, the environmental pressure around the emitter can typically not be further reduced. Hence, there is a limit how far the presence of residual gas molecules can be eliminated. Even in an ultra high vacuum, fluctuations in the emission current will typically occur after some time.

To clean the emitter and to desorb residual gas molecules therefrom, the emitter can be subjected to flash cleaning or "flashing the emitter". Flash cleaning typically includes heating the emitter to a high temperature for a short time. The high temperature, i.e. the value of the flash temperature, may e.g. be in the range from 1500 to 2500 K, typically from 1800 to 2200 K, even more typically from 1900 to 2100 K. The short time interval during which the flash temperature is applied, i.e. the flash time, may e.g. be in the range from some tenth of a second to some seconds, e.g. from 0.1 s to 10 s. The flash time can be below 10 seconds, e.g. from 1 s to 9 s, or be below 1 second, e.g. from 0.1 s to 0.9 s.

However, flash cleaning can introduce the following problem. Under the high flash temperatures, the emitter may gradually change its shape. The rate of change of shape depends on the value of the flash temperature and on the electric field the emitter is exposed to. This electric field is typically introduced by voltages applied to suppressor and extractor electrodes in relation to the emitter potential. The change of shape may include an increase or decrease of the curvature radius of an emitter tip. After flash cleaning, when resuming operation under the predetermined operation parameters, the change of shape of the emitter can lead to a change in the emission current. Hence, while fluctuations of the emission current due to adsorbed residual gas molecules are reduced by flash cleaning, another source for changes such as drift and/or fluctuations can be generated by the change of shape of the emitter during flash cleaning. As a result, the emission current of the device, under otherwise unchanged operation conditions, may suffer destabilization.

To compensate these changes, the values of, e.g., emitter voltage, suppressor voltage and/or extractor voltage can be adapted during operation under the predetermined operation parameters as described in EP 2088614. While the emission current may be stabilized for some time in this way, the shape of the emitter may still change more and more as flash cleaning is repeated, possibly up to the point where the fluctuations in the emission current introduced thereby can no longer be compensated during operation under the predetermined operation parameters. Additionally, the quality of the charged particle beam, e.g. its shape or intensity profile, may be worsened due to the change of the emitter shape. Such further disadvantages of the change of the emitter shape may necessitate further compensation by particle beam optics, if this is possible at all.

To overcome these difficulties, according to embodiments described herein, the electric field that the emitter is subjected to is adapted during flash cleaning. Accordingly, the electric field experienced by the emitter tip or the field "seen" by the emitter tip is adjusted during a cleaning process. From theoretical considerations and depending on the flash temperature, there is a certain electric field for which the shape of the emitter stays constant. If the actually applied electric field during flash cleaning is higher, the radius of an emitter tip will be reduced, i.e. the emitter tip will become sharper. If the actually applied electric field during flash cleaning is lower, the radius of the emitter tip will be increased, i.e. the emitter tip will become broader. Hence, during flash cleaning, the shape of the emitter can be influenced as desired by applying appropriate electric fields. Deformations of the emitter, e.g. introduced by prior flash cleaning operations, can thus be corrected. The emission current can be stabilized in this way.

According to embodiments described herein, a method for stabilizing the emission current of an emitter of a charged particle beam device is provided. The charged particle beam device may be an electron beam device or ion beam device. The emitter may be an electron or ion emitter. According to some embodiments, the emitter is a cold field emitter, typically a cold field electron emitter. The emitter typically has an emitter tip.

The emitter, respectively the charged particle beam device, may be operated under predetermined operation parameters, for instance for the purpose of beam lithography, inspection or testing of samples. The predetermined operation parameters include at least one voltage. The at least one voltage may be at least one voltage selected from the group consisting of: the emitter voltage, the suppressor voltage, and the extractor voltage. The predetermined operation parameters may include a voltage configuration, e.g. a configuration wherein the relative voltages of the emitter, suppressor and/or extractor are specified. The at least one voltage or voltage configuration can generate an electric field at or around the emitter. The predetermined operation parameters may include the emitter field, i.e. the electric field applied to, or felt by, the emitter.

The predetermined operation parameters may further include at least one physical quantity selected from the group consisting of: the emitter temperature, vacuum conditions, material of the components such as tungsten, e.g. cathode material. Typically, the emitter is housed in an emitter chamber, and the vacuum may be applied within the emitter chamber. The vacuum level or value of the vacuum pressure, i.e. the environmental pressure under which the emitter is operated, can e.g. be in the range from $10^{-12}$ to $10^{-5}$ Pa, typically from $10^{-11}$ to $10^{-6}$ Pa, even more typically from $10^{-10}$ to $10^{-7}$ Pa, e.g. about $10^{-9}$ Pa.

As shown in FIG. 1, the emitter is operated 110 under such predetermined operation parameters. The method for stabilizing the emission current further includes determining 112 a first value of the emission current under the predetermined operation parameters. The value of the emission current can e.g. be determined by measuring the current flowing into the emitter, or by measuring the current induced by impingement of the charged particle beam on components of the charged particle beam device, or by a combination thereof. The components of the charged particle beam device may be electrodes such as the anode or apertures.

Additionally or alternatively, a Faraday cup, a contactless measuring method making use of induction or the like, can be used to determine a value of the emission current. The term "determining a value of the emission current" can generally mean that the total emission current is measured or only a part thereof. The measured or determined part of the emission current may, for instance, be induced by the part of the charged particle beam impinging on an aperture.

The method for stabilizing the emission current further includes flash cleaning 120 the emitter. During this flash cleaning process 120, a first electric field is applied to the emitter. The first electric field is generated by the at least one voltage. As described above, the at least one voltage may be at least one voltage selected from the group consisting of: the emitter voltage, the suppressor voltage, and the extractor voltage.

The at least one voltage has at least one first value during flash cleaning. Thereby, for each of the at least one voltage at least one corresponding value is provided. The at least one first (corresponding) value of the at least one voltage applied during flash cleaning may be, and typically is, different from the predetermined value of the at least one voltage applied during operation under the predetermined operation parameters.

The above need not imply that the at least one voltage is constant during flash cleaning. It could assume values different from the at least one first value as well. Such a situation could e.g. arise during a ramp up or ramp down phase, but is not limited thereto.

According to embodiments described herein, the at least one first value of the at least one voltage is provided in dependence of the determined first value of the emission current. In FIG. 1, this is indicated by the arrow pointing from the box with reference sign 112 to the box with reference sign 120. Thereby, a feedback loop is established.

As explained above, the first value of the emission current can hold information about, and be used as an indicator for, a change in the emitter shape. The indication may possibly not so clear when changes in the emission current due to adsorption of residual gas molecules on the emitter have taken place. Hence, the first value or the emission current may be determined substantially directly after a prior flash cleaning process. Substantially directly after a prior flash cleaning process means that the influence of changes in the emission current due to adsorption of residual gas molecules is still small or negligible.

The determined first value of the emission current can indicate that the emitter tip has become sharper. Typically a sharper emitter tip, i.e. a tip with reduced radius of curvature, is indicated by an increased emission current as compared to a prior measurement under the same operation parameters. Then, during the flash cleaning 120, the first electric field is adapted correspondingly. Typically, this means that the first electric field is made weaker as compared to the electric field applied to the emitter tip during a prior flash cleaning operation. Conversely, the first value of the emission current can indicate that the emitter tip has become broader. Typically a broader emitter tip, i.e. a tip with larger radius of curvature, is indicated by a reduced emission current as compared to a prior measurement under the same operation parameters. Then, during the flash cleaning 120, the first electric field is adapted correspondingly, meaning that the first electric field is made stronger as compared to the electric field applied to the emitter tip during a prior flash cleaning operation.

The electric field applied to the emitter is generated by the at least one voltage with the at least one first value that depends on the determined first value of the emitter current as described above. Typically, the electric field is generated by certain values of the emitter voltage, suppressor voltage and/or extractor voltage. Generally, voltages are relative to a reference potential, e.g. mass. At least one of said voltages can be on mass potential itself. Changes in the values of emitter, suppressor and/or extractor voltage are relative to each other. For example "increasing the value of the extractor voltage" may be equivalent to "lowering the value of all other voltages", e.g. of emitter and/or suppressor voltage, as mentioned before and understood by those skilled in the art. Any equivalent voltage configurations leading to the same electric field experienced by the emitter shall be included in embodiments described herein, irrespective of the use of particular wordings such as "increasing a specific voltage", "decreasing a specific voltage" etc.

The method for stabilizing the emission current including the feedback loop for adjusting the electric field at the emitter during flash cleaning can generally also include conventional stabilization of the emission current during operation under the predetermined operation parameters. In the conventional stabilization, a value of the emission current measured during operation under the predetermined operation parameters is used to control, and possibly adapt, the at least one predetermined value of the at least one voltage, such as the predetermined values of the emitter voltage, extractor voltage and/or suppressor voltage, during operation under the predetermined operation parameters.

Further values of the emission current apart from the determined first value of the emission current can be measured during operation under the predetermined operation parameters. For instance, by repeating such measurements, the point in time when flash cleaning is needed may be determined. Increased changes in the measured values of the emission current can indicate the presence of adsorbed gas molecules on the emitter. Information from such further measurements of the emission current, i.e. the corresponding values, may optionally also be used for determining the appropriate electric field and a corresponding voltage configuration for flashing the emitter.

Figure 2:
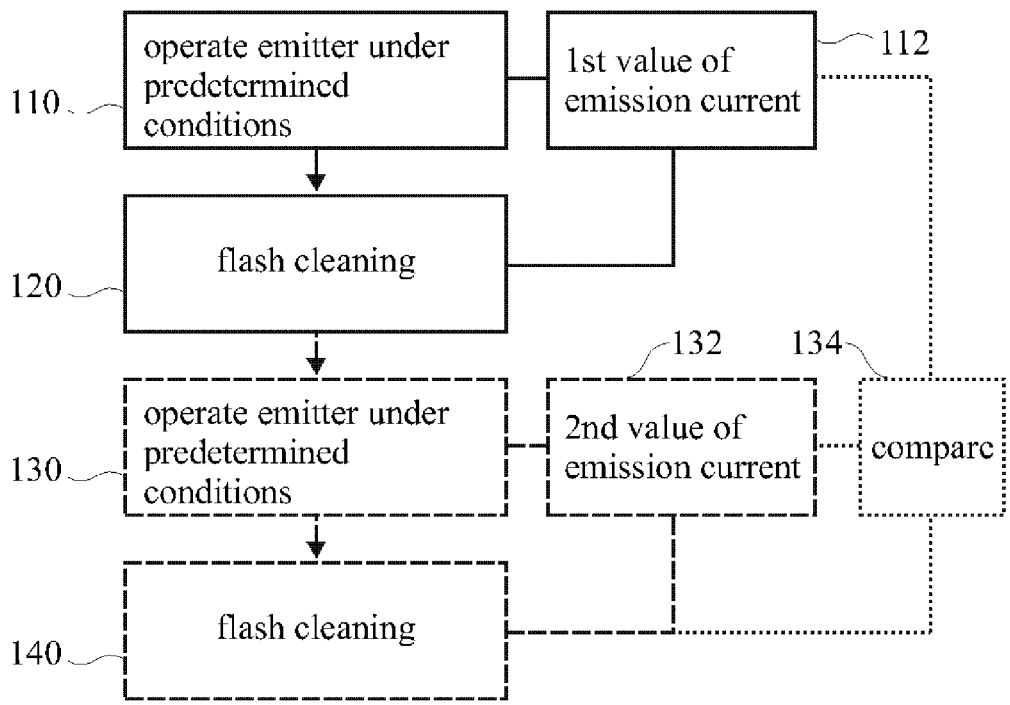
FIG. 2 illustrates another method for stabilizing the emission current of an emitter of a charged particle beam device according to embodiments described herein
Figure 3:
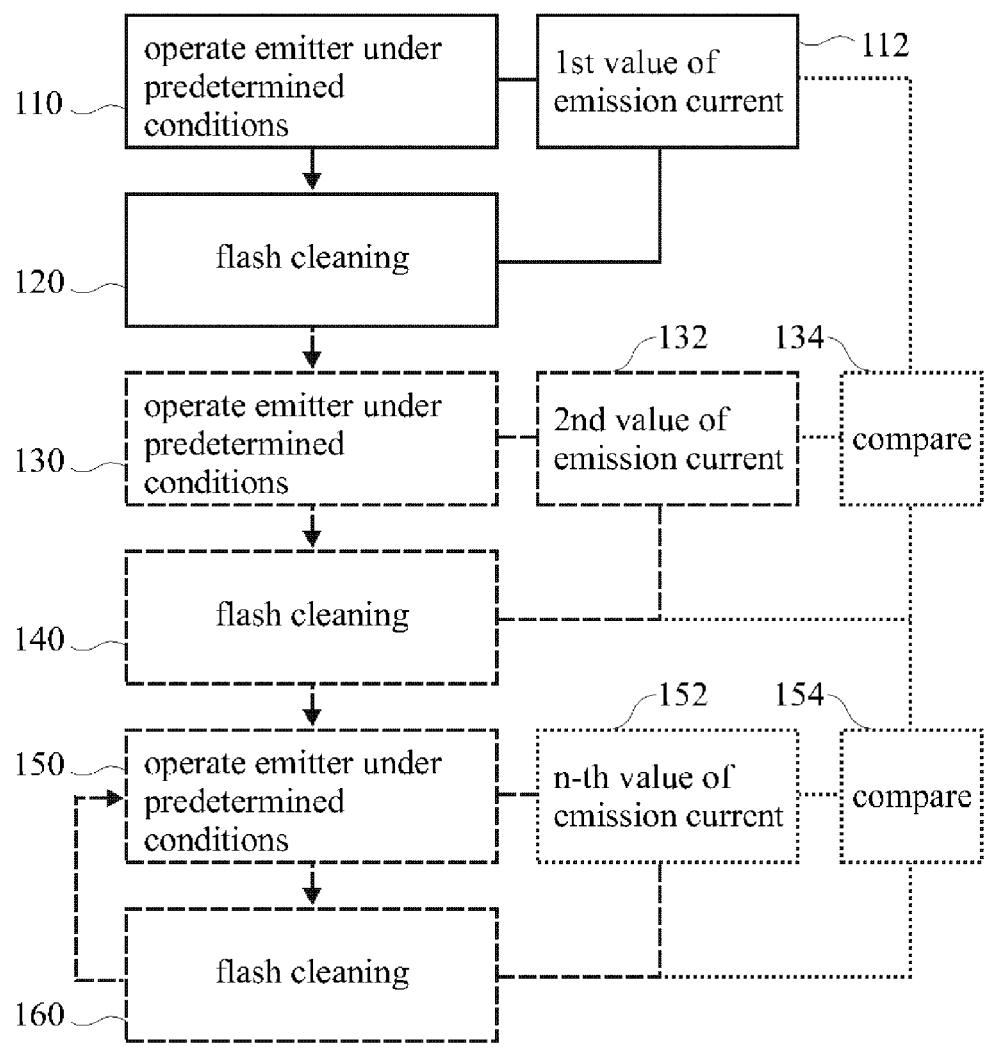
FIG. 3 illustrates a further method for stabilizing the emission current of an emitter of a charged particle beam device according to embodiments described herein.

As shown in FIGS. 2 and 3 by the dashed boxes and arrows, respectively the dotted boxes and arrows, the feedback loop may be repeated. In FIG. 2, the feedback loop is repeated twice. In typical embodiments, the feedback loop is iterated. The feedback loop may be repeated more than twice, e.g. n times, where n is an integer. In this way, a trend in the emission current can be detected, e.g. by comparing the values of emission currents measured after each flash cleaning operation. The feedback loop will adjust the electric field during a flash cleaning operation according to the trend in the emission current.

As shown in FIG. 2, according to some embodiments, the method for stabilizing the emission current can include operating 130 the emitter under predetermined operation parameters, after the flash cleaning 120, and determining a second value of the emission current. Optionally, the first and second value of the emission current may be compared 134. In this way, it can e.g. be verified whether the emission current has been successfully changed and/or stabilized during flash cleaning 120. Also the electric field applied during subsequent flash cleaning 140 can depend on the second value of the emission current as described below.

The predetermined operation parameters are typically the same as those during operation 110 prior to flash cleaning 120. However, e.g. if the beam application is changed such as from lithography to inspection, the predetermined operation parameters after flash cleaning 120 can also be different from the predetermined operation parameters prior to flash cleaning 120.

In some embodiments, the method also includes flash cleaning 140 the emitter while a second electric field is applied to the emitter, the second electric field being generated by the at least one voltage with at least one second value, wherein the at least one second value of the at least one operation voltage is provided 132 in dependence of the determined second value of the emission current.

In further embodiments, the at least one second value of the at least one voltage is determined in dependence of the first value of the emission current and the second value of the emission current. The dependence can be a relation such as a difference or a ratio, or a trend. To determine a relation or trend, the first and second values of the emission current may be compared 134, as shown in FIG. 2. By comparing the first and second values of the emission current, and setting them into a relation, a trend in the change of the emission current can be determined. The corresponding information can be used to achieve stabilization of the emitter shape and therefore of the emission current.

For example, if the at least one voltage is an extractor voltage, the second value of the extractor voltage is made smaller in case the second value of the emission current is larger than the first value of the emission current, and larger in case the second value of the emission current is smaller than the first value of the emission current. If the at least one voltage is a suppressor voltage, the second value of the suppressor voltage is made smaller in case the second value of the emission current is smaller than the first value of the emission current, and larger in case the second value of the emission current is smaller than the first value of the emission current.

Further, as shown in FIG. 3 by the dotted boxes 150, 152, 154, and 160, and by the corresponding dotted arrows, the feedback loop may be iterated more than twice. In FIG. 3, operating 150 the emitter under predetermined operation parameters, e.g. as required by the optical system of the charged particle beam device, is followed by flash cleaning operations 160. Therein, the electric fields at the emitter during flash cleaning are controlled by determining 152 an n-th value of the emission current and providing corresponding values to the at least one voltage for generating the emitter field. Therein, n may be any natural number. Any of, or any subset of, the first, second, and higher value of the emission current, up to the n-th value, can be compared 154. In this way, a long term trend can be determined. Long term stability can be achieved, when this information is used to control the flash cleaning process 160, in particular the electric field seen by the emitter. The flash cleaning operation 160 may be repeated periodically. In other embodiments, the flash cleaning operation 160 is repeated when needed. To determine when a flash cleaning operation is needed, further values of the emission current may be determined during each phase of operation under predetermined operation parameters as described above.

During flash cleaning, the electric field strength experienced by the emitter may typically be reduced as compared to operation under the predetermined operation parameters. Generally, field strengths during flash cleaning may e.g. lie in the range from 20 to 80%, typically from 25 to 70%, even more typically from 30 to 50%, or be below 50% or even below 40% of the electric field generated by the at least one voltage with the at least one predetermined value under the predetermined operation parameters. The amount of reduction of the emitter field is determined by the feedback loop described above. The electric fields applied to the emitter, respectively to the emitter tip, are chosen in a way that leads to the best long term stability of the emitter shape.

Generally, physical quantities other than the at least one voltage may be controlled as well. For example, as explained above, whether the emitter tip becomes sharper or broader if subjected to a certain electric field during flash cleaning also depends on the flash temperature. In some embodiments, the flash temperature is provided in dependence of the first value of the emission current, of the second value of the emission current, of the n-th value of the emission current, or in dependence of values derived from any of the foregoing values or from any subset thereof.

Generally, for given flash cleaning conditions including flash temperature and material of the emitter, there exists a certain optimal electric field applied to the emitter. Optimal means that, with the optimal emitter field applied, the shape of the emitter does not change. Hence, this field is optimal for stabilization of the emitter shape. The desired emitter field can be this optimal electric field. According to further embodiments, a desired field suitable for the stabilization of the emitter shape is determined, such as the optimal field for stabilization of the emitter shape. Determining may include calculating the desired/optimal field or measuring the desired/optimal field. The desired/optimal field can e.g. be measured in a test set-up of an emitter chamber. In particular, since the emitter field is generated by the at least one voltage or voltage configuration, determining the desired/optimal field may include determining the desired/optimal value(s) of the at least one voltage or voltage configuration for stabilization of the emitter shape.

According to a further embodiment, a method for stabilizing the emission current of an emitter of a charged particle beam device is provided. In the method, the emitter is operated under predetermined operation parameters including at least one voltage with a predetermined value of the at least one voltage. The method includes flash cleaning the emitter while a first electric field is applied to the emitter. The first electric field is generated by the at least one voltage having a first value of the at least one voltage, wherein the first value of the at least one voltage is provided in dependence of the determined, e.g. a calculated or measured, optimal electric field for stabilization of the emitter shape during flash cleaning.

Figure 4:
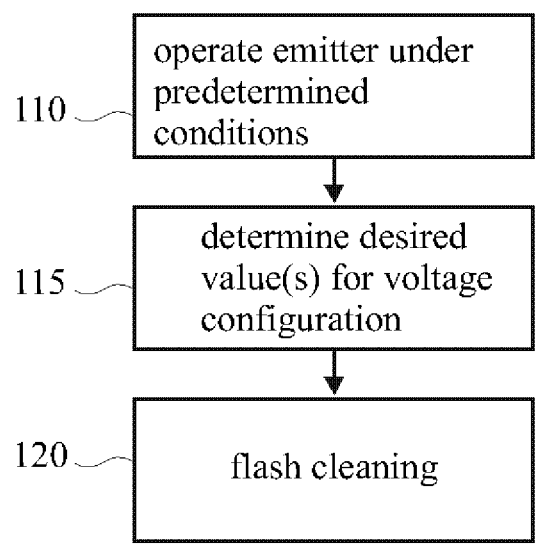
FIG. 4 illustrates a yet further method for stabilizing the emission current of an emitter of a charged particle beam device according to embodiments described herein.

FIG. 4 illustrates a method for stabilizing the emission current, wherein the emitter is operated (110) under predetermined conditions. Then, a desired, e.g. optimal, value or values for the at least one voltage or voltage configuration is determined (115). Alternatively, the determination can also be made before or during operation under the predetermined conditions. Flash cleaning (120) is done with a voltage configuration (e.g. emitter, suppressor and extractor voltage configuration) in dependence of the determined desired/optimal value(s) for the at least one voltage or voltage configuration.

The above embodiments can be combined with any of the embodiments described herein. In particular, it can happen that the determined optimal emitter field is not actually correctly determined and/or other errors hinder application of the theoretically optimal field, e.g. due to measurement errors in determining the operation conditions. Then, the stabilization method described above (e.g. with respect to FIGS. 1 to 3), according to which a feedback loop for controlling the change of the emitter shape is implemented, can correct the shape changes that occur in spite of the effort to apply an optimal field using determined optimal value(s) of the at least one voltage.

Hence, the method may further include determining a first value of the emission current under the predetermined operation parameters. Further, the first value of the at least one voltage may be provided in dependence of the determined, e.g. a calculated or measured, optimal values of the at least one voltage for stabilization of the emitter shape during flash cleaning and in dependence of the determined first value of the emission current. Also, the value(s) of the at least one voltage, which determine the emitter field, may be adapted in dependence of any subsequently determined, $n^{th}$ value of the emission current in addition to the optimal value(s) of the at least one voltage.

For example, if an attempt to provide the optimal values of the emitter, extractor and suppressor voltage has been made during a first flash cleaning operation, but afterwards the measured value of the emission current during operation under the normal, pre-determined conditions indicates that the emitter shape has changed, then, during a second flash cleaning operation, a deviation from the optimal values of emitter, extractor and suppressor voltage is made to compensate the unintended shape change.

Conversely, any of the embodiments of the method for stabilizing the emitter shape wherein a feedback loop is implemented as described above (e.g. with respect to FIGS. 1 to 3), may be combined with the aspect of determining a desired or optimal emitter field and desired or optimal values of the at least one voltage, respectively. For instance, it could happen that the counter-measures taken by the feedback loop to undo the shape change of the emitter are always too strong, meaning that the shape of the emitter having been too broad will be too sharp after the next flash cleaning and vice versa. A comparison to calculated or measured optimal values of the at least one voltage may help to avoid such over-compensation.

Further, the feedback loop in combination with the desired/optimal emitter field or voltage configuration can lead to a convergence of the feedback loop. Convergence means that the shape of the emitter shape is changed less and less from one flash cleaning process to the next and is stabilized near or at the desired (e.g. original) shape. For enhanced convergence, the determined desired or optimal emitter field, respectively the desired or optimal voltage configuration, can be re-determined (e.g. re-calculated). The re-determination may be based on the determined values of the feedback loop, e.g. on the determined n emitter currents, where n is an integer. For instance, using such data, the model that forms the basis for the calculation of the optimal voltage configuration may be enhanced.

According to some embodiments, the electric field generated by the at least one voltage with at least one first value during flash cleaning is compared to the determined desired or optimal value of the at least one voltage, e.g. to the theoretically optimal field generated thereby under which the shape of the emitter would not change. The at least one first value may be determined in dependence of the outcome of this comparison. In this way, it can be determined how much the electric field is to be changed advantageously in order to avoid over-compensation and an oscillation between an emitter tip that is too sharp after one flash and too broad after the next flash. The method may further include re-determining the desired of optimal value of the at least one voltage in dependence of the determined first value of the emission current.

According to further embodiments, a device for stabilizing the emission current of an emitter of a charged particle beam device is provided. The device for stabilization includes an emitter, a voltage generating system, a measurement unit, and a feedback loop system. The device may further include other electrodes, such as a suppressor, an extractor, an anode, an aperture and/or further optical components for shaping and/or deflecting the charged particle beam.

Figure 5:
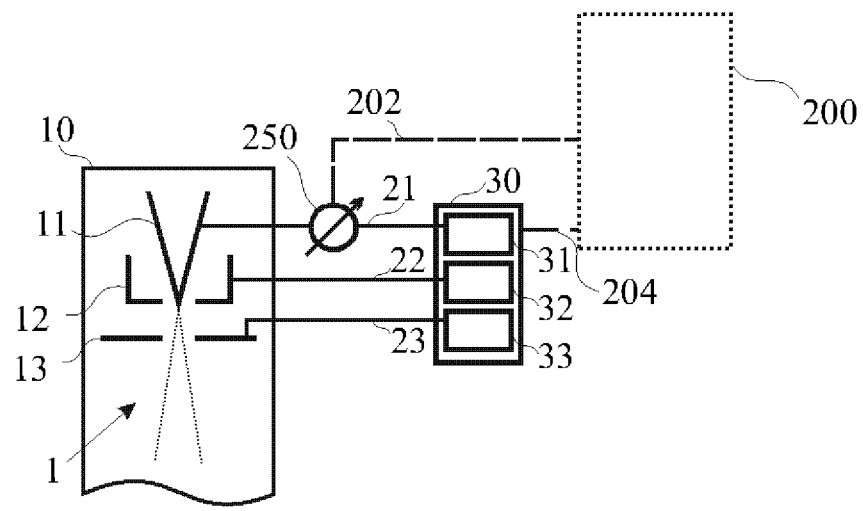
FIG. 5 show a schematic view of a device for stabilizing the emission current of an emitter of a charged particle beam device according to embodiments described herein.

In FIG. 5, a part of a column of charged particle beam device 10 is shown. FIG. 5 shows an emitter 11 for emitting a charged particle beam 1, a suppressor 12, and an extractor 13. These are connected via connection lines 21, 22, 23 to respective voltage sources 31, 32, 33 of the voltage generating system 30. A measurement unit 250 is shown that is adapted for determining the value of the emission current. In FIG. 5, the measurement unit is shown as an amperemeter in the connection line 21 connecting the emitter to the emitter voltage source 31. However, the measurement unit could also be a unit which measures the emission current induced by the charged particle beam, or parts thereof, on other objects such as electrodes of the charged particle beam device, a Faraday cup, or another current measurement device.

Generally, the emitter is adapted to emit a charged particle beam. The charged particle beam is related to an emission current. The emission current has a value, e.g. a specific value under predetermined operation parameters. The predetermined operation parameters include at least one voltage with at least one predetermined value. As in the method described above, the at least one voltage can e.g. be an emitter voltage, a suppressor voltage, and/or an extractor voltage. The measurement unit is adapted for determining the value of the emission current.

The voltage generating system is adapted to provide the at least one voltage to the charged particle beam device. The voltage generating system may be adapted to provide the at least one voltage with a predetermined value during operation under the predetermined operation parameters, and to provide the at least one operation voltage with at least one other value during flash cleaning of the emitter. The voltage generating system may provide the at least one voltage with adaptable values.

For example, the voltage generating system 30 shown in FIG. 5 may be adapted to provide an adaptable emitter voltage from emitter voltage source 31 to emitter 11, an adaptable suppressor voltage from suppressor voltage source 32 to suppressor 12, and an adaptable extractor voltage from extractor voltage source 33 to extractor 13.

The feedback loop system of the device for stabilizing the emission current is operatively coupled to the measurement unit for receiving the measured value of the emission current. Further, the feedback loop system is operatively coupled to the voltage generating system for controlling the at least one adaptable value of the at least one voltage during flash cleaning of the emitter in dependence of the received value of the emission current.

In FIG. 5, the feedback loop system is represented by the dotted box 200, which is connected to the measurement unit 250 by connection line 202. The feedback loop system 200 is coupled to the voltage generating system 30 by connection line 204. The feedback loop system 200 may determine, from the received value of the emission current, whether the voltage generating system 30, and the voltage sources 31, 32, 33 respectively, shall adapt the value of the voltages provided to the components 11, 12, 13 during flash cleaning in order to generate a suitable electric field at the emitter 11 for stabilizing the shape of the emitter. Which electric fields are suitable under given situations has been described above with respect to the method for stabilizing the emission current.

The feedback loop system may be implemented by hardware such as electric circuits, integrated electric circuits, FPGAs, microchips, or conventional computers. The control logic of the feedback loop may be hard-wired or be implemented by software, e.g. run on hardware such as microchips or conventional computers. The feedback loop system can include a memory unit and/or comparator logic. The feedback loop system may be adapted to control the at least one adaptable value of the at least one voltage during flash cleaning of the emitter in dependence of a relation between the received value of the emission current and a prior value of the emission current. The relation, e.g. a ratio or difference, may be formed by the comparator logic. The prior value of the emission current may be stored in the memory unit.

Figure 6:
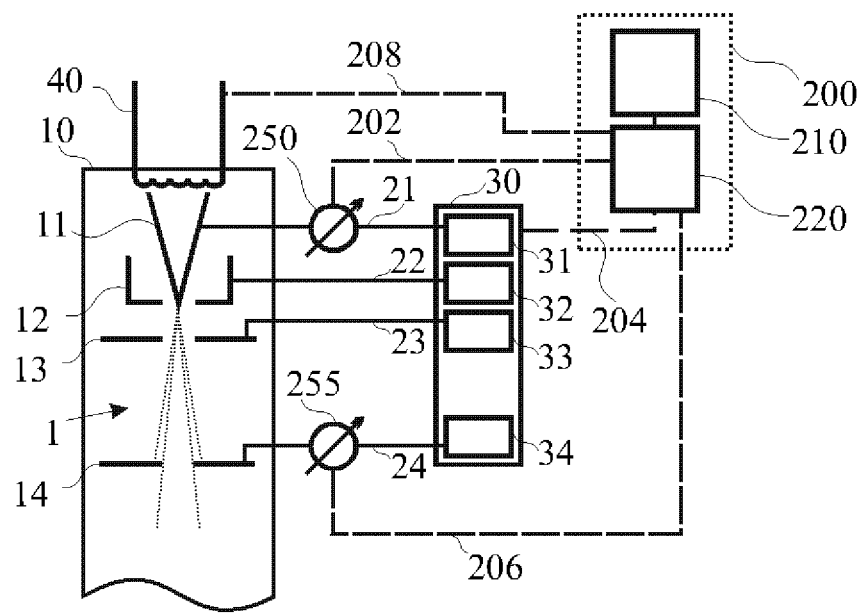
FIG. 6 show a schematic view of yet another device for stabilizing the emission current of an emitter of a charged particle beam device according to embodiments described herein.

In FIG. 6, the feedback loop system 200 of the device for stabilizing the emission current includes a comparator 220 and a memory unit 210. Further, the device includes an electrode 14, e.g. the anode or other aperture, on which part of the charged particle beam 1 impinges during operation. The electrode 14 is connected to a voltage source 34 via connection line 24.

A second measurement unit 255, which can, according to different embodiments, be provided additionally or alternatively to the first measurement unit, is arranged at the connection line 24. The second measurement unit 255 can determine a value of the emission current emitted from the emitter 11, respectively of a current value equivalent to the charge impinging on the electrode 14. This current value is forwarded via connection line 206 to the comparator 220. As value of the emission current, either the value transmitted by line 202 or the value transmitted by line 206 may be used, or else any combination thereof may be used, e.g. a weighted, possibly normalized sum. The current value determined by the second measurement unit 255 can provide additional information. While the first measurement unit 250 measures the total emission current, the second measurement unit 255 measures only the part impinging on the electrode 14. The part of the charged particle beam impinging on the electrode 14 may also depend on deformations of the emitter that do not influence the total emission current but the alignment of the charged particle beam. The fraction of charged particles impinging on the electrode 14 may also depend on other misalignments of the charged particle beam. In both cases, the corresponding signal transmitted via line 206 contains information thereabout that would go unnoticed when only the signal via line 202 is transmitted.

The comparator 220 can use information from prior values of the emission current stored in memory unit 210, from the value transmitted by line 202 and/or from the value of the emission current transmitted by line 206 to determine which values of the voltages from sources 31-34 shall be applied during the next flash cleaning of emitter 11 in order to provide a suitable electric field. Further, the comparator 220 can also control the flash temperature to which the emitter is subjected. To this end, the comparator is connected via line 208 to a heating device 40 that provides the flash temperature.

For example, the device for stabilizing the emission current may carry out the following method. The device monitors the emission current after each flash cleaning, using at least one of measurement units 250 and 255. By using values of the emission current transmitted from the at least one measurement unit, and by comparing these to prior values stored in the memory 210, the comparator 220 can discover a trend towards higher currents when the emitter tip becomes gradually sharper, and to lower currents when the emitter tip becomes gradually broader. In the first case, the device will react with reduction of the electric field experienced by the emitter during flash cleaning, in the second case by increasing the applied electric field. This electric field is typically created by certain values of the extractor and suppressor voltage relative to the emitter voltage. These voltages are adapted accordingly.

The device may be operated under predetermined operation parameters required by the optical system of the charged particle beam device, and be periodically subjected to flash cleaning in order to keep the emission surface of the emitter clean from adsorbed molecules. During flash cleaning, the electric field applied to the emitter tip is typically reduced, e.g. to below 60% or below 50% or below 40%, e.g. about 20-35% of the field strength under the predetermined operation parameters for normal emission. The value of reduction depends on the feedback loop executing control of the field. The electric field can e.g. be increased by increasing the extractor voltage and/or lowering the suppressor voltage. Vice versa, the electric field can e.g. be decreased by decreasing the extractor voltage and/or increasing the suppressor voltage. By controlling the voltage generating system 30, the feedback loop system 20 can control these voltages and hence the field seen by the emitter in a way that the best long term stability of the emitter shape is achieved. Thereby, the emission current is stabilized.

Generally, any device for stabilizing the emission current described herein, e.g. the embodiments of the device described with respect to FIGS. 5 and 6, may be adapted to carry out any of the embodiments of the method for stabilizing the emission current described herein, e.g. the method described with respect to FIGS. 1 to 4.

In further embodiments, use of a device for performing the method according to embodiments described herein is provided. Therein, the device may be any of the devices according to embodiments described herein.

According to further embodiments, a computer program product is provided. The computer program product makes a computer control system of a charged particle beam device perform the method according to embodiments described herein when the computer program product is loaded into the memory of the computer control system.

While the foregoing is directed to embodiments of the invention, other and further embodiments of the invention may be devised without departing from the basic scope thereof, and the scope thereof is determined by the claims that follow.

The invention claimed is:

1. A method for stabilizing the emission current of an emitter of a charged particle beam device, the emitter being operated under predetermined operation parameters comprising at least one voltage with a predetermined value of the at least one voltage, the method comprising:
   measuring a first value of the emission current under the predetermined operation parameters; and
   flash cleaning the emitter while a first electric field is applied to the emitter, the first electric field being generated by the at least one voltage having a first value of the at least one voltage, wherein the first value of the at least one voltage is adjusted in response to the measured first value of the emission current during the flash cleaning.

2. The method according to claim 1, further comprising:
   operating the emitter under the predetermined operation parameters and determining at least one second value of the emission current; and
   flash cleaning the emitter while a second electric field is applied to the emitter, the second electric field being generated by the at least one voltage having a second value of the at least one voltage, wherein the second value of the at least one voltage is provided in dependence of the determined second value of the emission current.

3. The method according to claim 2, wherein the at least one second value of the at least one voltage is determined in dependence of the first value of the emission current and the second value of the emission current.

4. The method according to claim 1, wherein the at least one voltage is at least one element selected from the group consisting of: an emitter voltage, a suppressor voltage, and an extractor voltage.

5. The method according to claim 2, wherein, if the at least one voltage is an extractor voltage, the second value of the extractor voltage is smaller in case the second value of the emission current is larger than the first value of the emission current, and larger in case the second value of the emission current is smaller than the first value of the emission current, and wherein, if the at least one voltage is a suppressor voltage, the second value of the suppressor voltage is smaller in case the second value of the emission current is smaller than the first value of the emission current, and larger in case the second value of the emission current is larger than the first value of the emission current.

6. The method according to claim 1, wherein the first electric field has a field strength in the range from 20 to 80% of the electric field generated by the at least one voltage under the predetermined operation parameters.

7. The method according to claim 2, wherein the second electric field has a field strength in the range from 20 to 80% of the electric field generated by the at least one voltage under the predetermined operation parameters.

8. The method according to claim 1, wherein flash cleaning the emitter comprises heating the emitter to a flash temperature.

9. The method according to claim 8, wherein the flash temperature is from 1500 to 2500 K.

10. The method according to claim 1, wherein the emitter is a cold field emitter with an emitter tip.

11. The method according to claim 1, wherein the method further comprises providing an ultra high vacuum around the emitter.

12. A device for stabilizing the emission current of an emitter of a charged particle beam device, the device comprising:
   the emitter for emitting a charged particle beam defining an emission current, the emission current having a value under predetermined operation parameters, wherein the predetermined operation parameters comprise at least one voltage with at least one predetermined value;
   a voltage generating system for providing the at least one voltage to the charged particle beam device, wherein the voltage generating system is adapted to provide the at least one voltage with the predetermined value during operation under the predetermined operation parameters, and to provide the at least one voltage with an adaptable value of the at least one voltage during flash cleaning of the emitter;
   a measurement unit for measuring the value of the emission current; and
   a feedback loop system operatively coupled to the measurement unit for receiving the measured value of the emission current, and operatively coupled to the voltage generating system for controlling the adaptable value of the at least one voltage during flash cleaning of the emitter in response to the received measured value of the emission current.

13. The device according to claim 12, wherein the feedback loop system is adapted to control the at least one adaptable value of the at least one voltage during flash cleaning of the emitter in dependence of the received value of the emission current and a prior value of the emission current, the prior value of the emission current optionally being stored in a memory unit of the feedback loop system.

14. The device according to claim 12, further comprising an extractor and a suppressor, and the voltage generating system comprising a first voltage source coupled to the emitter for providing an emitter voltage, a second voltage source coupled to the suppressor for providing a suppressor voltage, and a third voltage source coupled to the extractor for providing a suppressor voltage, wherein the at least one voltage is at least one element selected from the group consisting of: the emitter voltage, the suppressor voltage, and the extractor voltage; and wherein, if the at least one voltage is the extractor voltage, the adaptable value of the extractor voltage is lowered in case the received value of the emission current is higher compared to a prior value, and raised in the opposite case, and, if the at least one operation voltage is the suppressor voltage, the adaptable value of the adaptable value of the suppressor voltage is raised in case the received value of the emission current is higher compared to a prior value, and lowered in the opposite case.

15. The device according to claim 12, further comprising a flash cleaning device for providing a flash temperature to the emitter.

16. The device according to claim 15, wherein the flash temperature is from 1500 to 2500 K.

17. The method according to claim 1, wherein the method is controlled by a computer program product loaded into the memory of a computer control system of a charged particle device.

18. A method for stabilizing the emission current of an emitter of a charged particle beam device, the emitter being operated under predetermined operation parameters comprising at least one voltage with a predetermined value of the at least one voltage, the method comprising:
flash cleaning the emitter while a first electric field is applied to the emitter, the first electric field being generated by the at least one voltage having a first value of the at least one voltage, wherein the first value of the at least one voltage is adjusted, in response to a measured desired value of the at least one voltage for stabilization of the emitter shape, during the flash cleaning.

19. The method of claim 18, further comprising:
determining a first value of the emission current under the predetermined operation parameters; and
flash cleaning the emitter while a second electric field is applied to the emitter, the second electric field being generated by the at least one voltage having a second value of the at least one voltage, wherein the second value of the at least one voltage is provided in dependence of the determined first value of the emission current.

20. The method according to claim 19, further comprising:
operating the emitter under the predetermined operation parameters and determining at least one second value of the emission current; and
flash cleaning the emitter while a third electric field is applied to the emitter, the third electric field being generated by the at least one voltage having a third value of the at least one voltage, wherein the third value of the at least one voltage is provided in dependence of the first value of the emission current and second value of the emission current.

* * * * *